United States Patent
Tsai et al.

(10) Patent No.: US 6,801,429 B2
(45) Date of Patent: Oct. 5, 2004

(54) PACKAGE STRUCTURE COMPATIBLE WITH COOLING SYSTEM

(75) Inventors: Tsung-Yueh Tsai, Kaohsiung (TW); Sheng-Yang Peng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/605,081

(22) Filed: Sep. 8, 2003

(65) Prior Publication Data

US 2004/0165351 A1 Aug. 26, 2004

(30) Foreign Application Priority Data

Feb. 26, 2003 (TW) .......................................... 92103999 A

(51) Int. Cl.[7] .............................................. H05K 7/20
(52) U.S. Cl. ...................... 361/687; 361/693; 361/686; 257/704; 257/702; 174/52.2
(58) Field of Search ................................. 361/687, 815, 361/676, 677, 688, 689, 693, 699; 174/52.2; 257/700–704, 787–790

(56) References Cited

U.S. PATENT DOCUMENTS

| | | | | |
|---|---|---|---|---|
| 4,047,198 A | * | 9/1977 | Sekhon et al. | ............... 257/713 |
| 5,291,064 A | * | 3/1994 | Kurokawa | ................... 257/714 |
| 5,696,405 A | * | 12/1997 | Weld | ........................... 257/714 |
| 6,263,957 B1 | * | 7/2001 | Chen et al. | ................ 165/80.4 |
| 6,437,437 B1 | * | 8/2002 | Zuo et al. | .................... 257/710 |

* cited by examiner

*Primary Examiner*—Randy W. Gibson
*Assistant Examiner*—Hung S. Bui
(74) *Attorney, Agent, or Firm*—Jiang Chyun IP Office

(57) ABSTRACT

The present invention relates to a package structure compatible with a cooling system, the package structure comprising a carrier, a chip, a mold compound and a cooling tubule that can be connected to a cooling system. The chip is arranged on the carrier and electrically connected to the carrier, while the mold compound covers the chip and one surface of the carrier. The cooling tubule is disposed either within the mold compound or on an outer surface of the mold compound. The cooling tubule is connected to a cooling tubing of the cooling system and a fluid driven by a pump circulates in the cooling tubing and the cooling tubule for heat dissipation.

6 Claims, 6 Drawing Sheets

PACKAGE STRUCTURE COMPATIBLE WITH COOLING SYSTEM

CROSS REFERENCE TO RELATED APPLICATIONS

This application claims the priority benefit of Taiwan application serial no. 92103999, filed on Feb. 26, 2003.

BACKGROUND OF INVENTION

1. Field of Invention

The present invention relates to a package structure. More particularly, the present invention relates to a package structure compatible with a cooling system.

2. Description of Related Art

In an information-explosion world, ICs are widely used in the daily life, including entertainment, education, transportation and households. The design of the electrical products becomes more complex and high-speed and multi-function chips are developed. As the integration of ICs keeps increasing and the layout of the high-speed semiconductor devices becomes dense, more heat is generated by the semiconductor device per unit area in a certain period. Thus, it is important for the design of semiconductor devices to consider the heat dissipation issue, in order to prevent damages to the electronic devices or the chips.

FIG. 1 is a cross-sectional view of a prior art wiring package structure. A chip 140 is arranged on a carrier 100 having a first surface 102 and a second surface 104. A die pad 110 and a plurality of pads 120 are disposed on the first surface 102, while a plurality of ball pads 130 are disposed on the second surface 104. A plurality of bonding pads 146 is disposed on an active surface 142 of the chip 140, and a back surface 144 of the chip 140 is attached to the die pad 110 through silver paste 150. Each bonding pad 146 is electrically connected to one of the pads 120 through a gold wire 160, thus electrically connecting the chip 140 with the carrier 100.

A mold compound 170 covers the chip 140, the gold wires 160 and the first surface 102 of the carrier 100 for protecting the chip 140 and the gold wires 160. A heat dissipation plate 180, for dissipating heat from the operation of the chip 140, is disposed on the outer surface of the mold compound 170.

In theory, the heat dissipation plate 180 can help dissipate heat generated from the operation of the chip 140 into the exterior of the mold compound. However, as discussed above, as the package becomes minimized and chip per unit area generates more heat in a certain period, it is unlikely to rely on the heat dissipation plate alone to dissipate all the heat. Therefore, the un-dissipated heat can cause serious damages to the electronic devices on the active surface of the chip. In fact, inefficient heat dissipation can cause quite a few problems, including: (1) the un-dissipated heat results in higher resistance for the current of the electronic device, thus influencing the signal transmission (signal delay) or giving rise to error signals; and (2) the un-dissipated heat deteriorate the performance of the electronic device, even shortening the life of the electronic device on the chip.

SUMMARY OF INVENTION

The present invention provides a package structure compatible with a cooling system, which can efficiently dissipate heat.

As embodied and broadly described herein, the present invention provides a package structure compatible with a cooling system, the package structure comprising a carrier, a chip, a mold compound and a cooling tubule that can be connected to a cooling system. The chip is arranged on the carrier and electrically connected to the carrier, while the mold compound covers the chip and one surface of the carrier. The cooling tubule is disposed either within the mold compound or on an outer surface of the mold compound. The cooling tubule is connected to a cooling tubing of the cooling system and a fluid driven by a pump circulates in the cooling tubing and the cooling tubule for heat dissipation.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
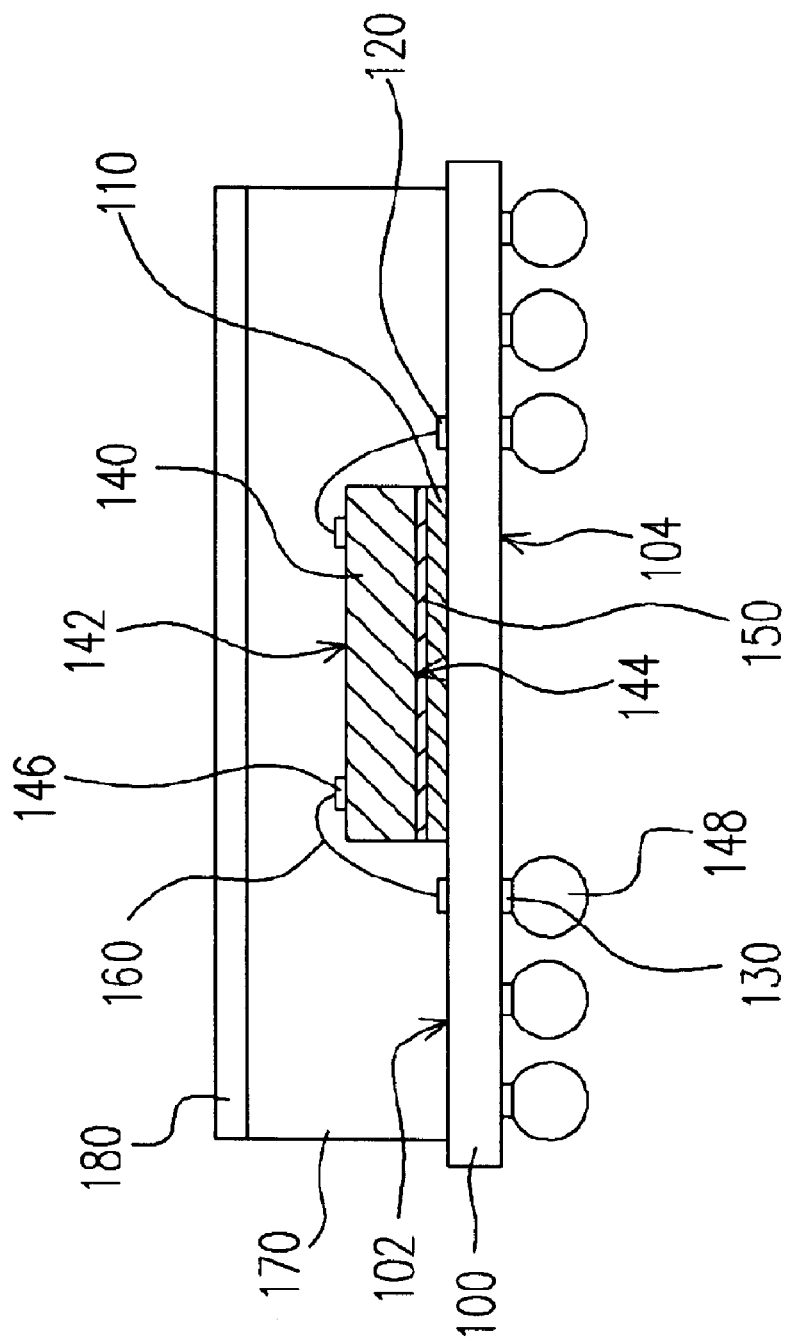
FIG. 1 is a cross-sectional view of a prior art wiring package structure.
Figure 2:
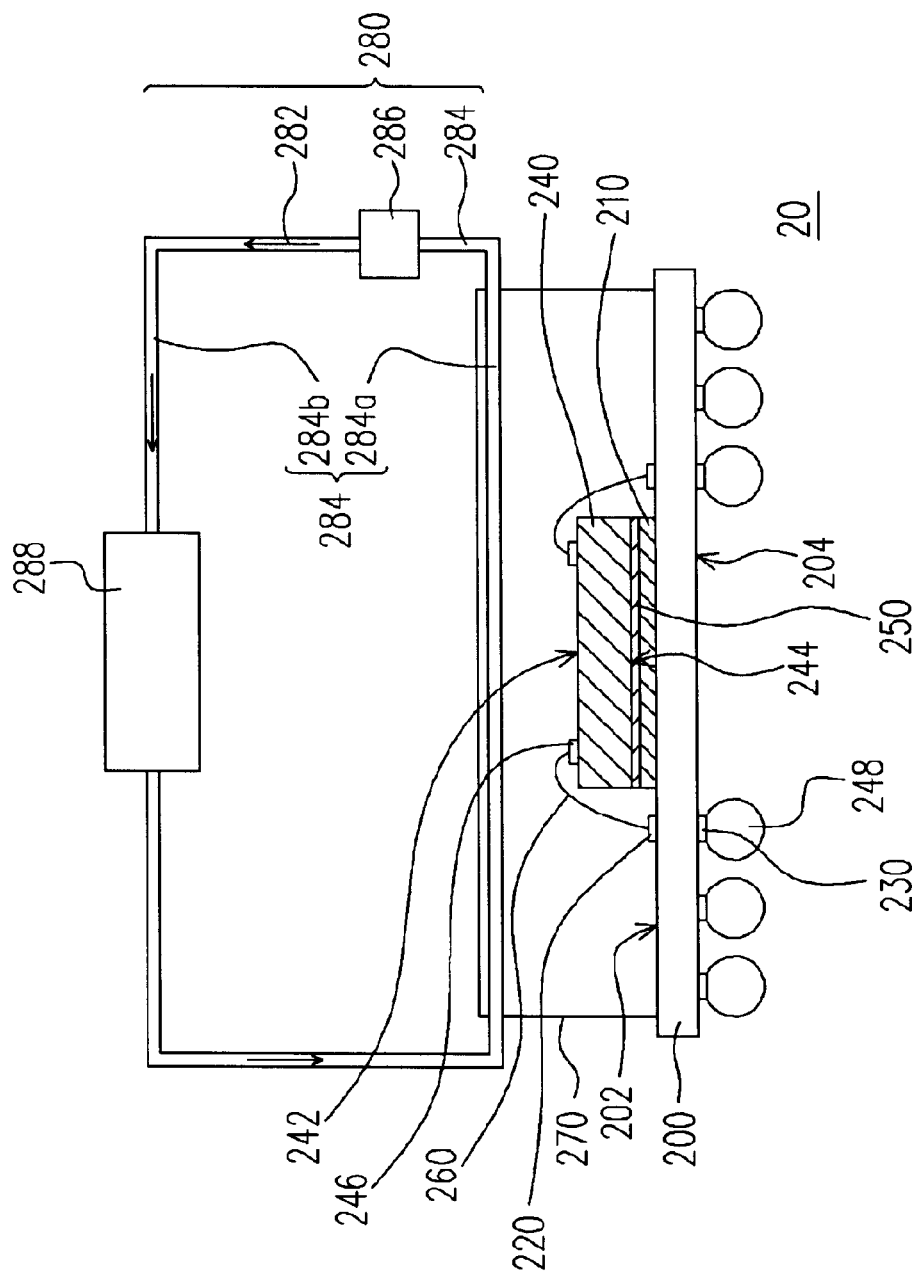
FIG. 2 is a cross-sectional view of a package structure according to one preferred embodiment of this invention.

FIG. 2 is a cross-sectional view of a package structure according to one preferred embodiment of this invention. In this embodiment, only one chip is illustrated in the package structure 20 as an example, but the scope of the present invention is not limited by this embodiment.

In FIG. 2, the package structure 20 includes a carrier 200 having a first surface 202 and a second surface 204. A die pad 210 and a plurality of pads 220 are disposed on the first surface 202, while a plurality of ball pads 230 are disposed on the second surface 204. The pads 220 are arranged around the die pad 210. A chip 240 having an active surface 242 and a back surface 244 is provided, while a plurality of bonding pads 246 is disposed on the active surface 242 of the chip 240. The chip 240 is arranged on the carrier 200 and the back surface 244 of the chip 240 is attached to the die pad 210 through silver paste 250. The chip 240 is fixed to the die pad 210 by silver paste 250. Each bonding pad 246 is electrically connected to one of the pads 220 through a gold wire 260, thus electrically connecting the chip 240 with the carrier 200. The carrier 200 can be (electrically or mechanically) connected to the next level substrate, such as a PCB board, through solder balls 248 formed on the ball pads 230 of the carrier 200.

A mold compound 270 covers the chip 240, the gold wires 260, the pads 220 and the first surface 202 of the carrier 200. The mold compound 270 can protect electronic devices on the active surface 242 of the chip 240 and the gold wires 260 (i.e. connection between the bonding pad 246 and the pad 220 or the carrier 200). The mold compound 270 is made of, for example, thermosetting plastics and preferably epoxy resins.

Referring to FIG. 2, a cooling system 280 includes a tubing 284 for transporting or circulating a fluid 282 and a pump 286. The fluid is, for example, water, coolants, gases or other cooling agents. The tubing 284 is made of metal or other suitable materials, for example. The pump 286 is coupled to the tubing 284 for pumping the fluid 282. The cooling system 280 is a close circulation system. That is, the fluid 282 is only circulating within the tubing 284 through the drive of the pump 286. The tubing 284 includes a cooling tubule 284a disposed within the mold compound 270 and a cooling tubing 284b disposed outside the mold compound 270. Usually, the cooling tubule 284a is arranged to the desired position before the mold compound 270 is applied. A portion of the cooling tubule 284a is exposed to be fitted to the cooling tubing 284b in the subsequent process. The cooling tubule 284a and the cooling tubing 284b can be fitted through connectors or fittings commonly used in the field. Preferably, the cooling tubule 284a has no contact with the electronic devices on the active surface or the gold wires. The cooling system 280 can further include a cooler 288 connected to the tubing 284 for enhancing the cooling efficiency of the cooling system 280. Different kinds of coolers can be used as the cooler 288, including cooling fins, air blowers or fans, heat exchanger and low temperature fluid tank. The cooler 288 can have heat exchange with the fluid 282, thus dissipating heat from the fluid 282.

As described above, the fluid 282, circulating through the cooling tubule 284a by the drive of the pump 286, can transfer heat generated (by the chip 240) within the mold compound 270 to the exterior of the package structure 20. While the chip 240 is in operation, the devices of the chip 240 generate a lot of heat. With the cooling system 280, the generated heat can be efficiently removed or transferred away, thus maintain performance of the devices and slow down the deterioration speed of the devices.

Figure 3:
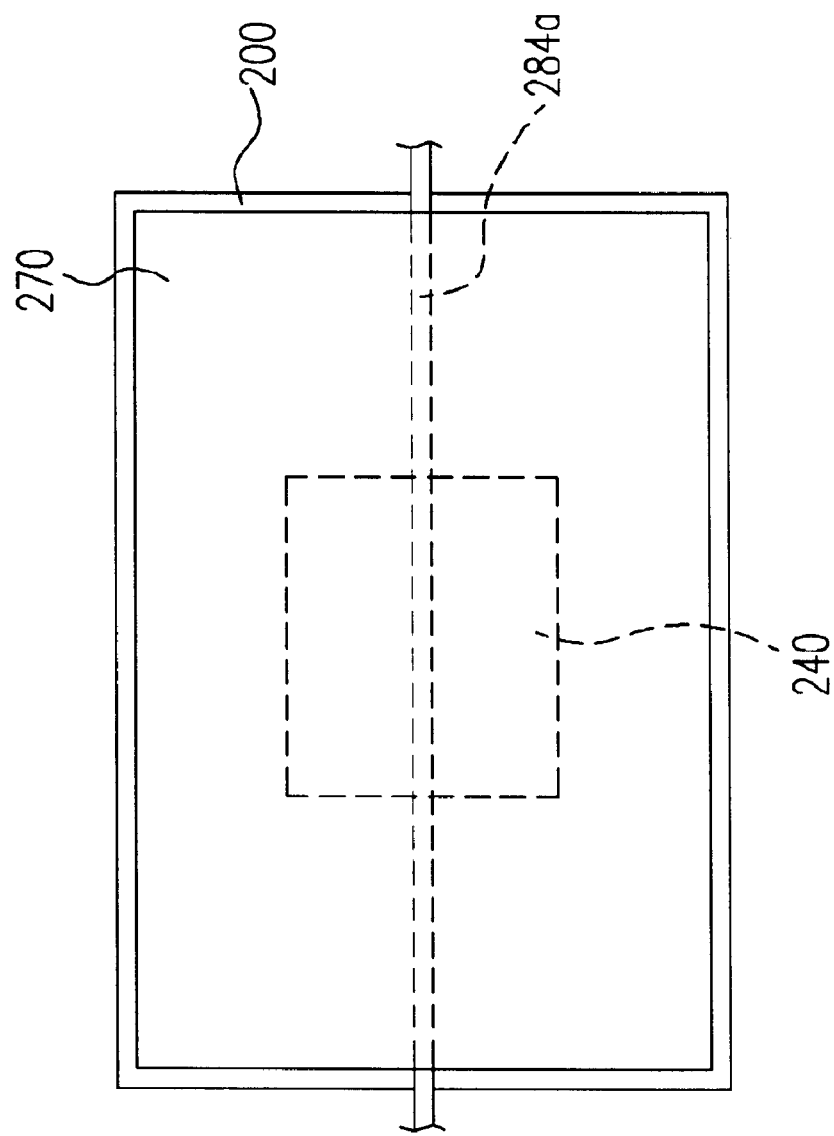
FIG. 3 is a top view of the package structure according to one preferred embodiment of the present invention.
Figure 4:
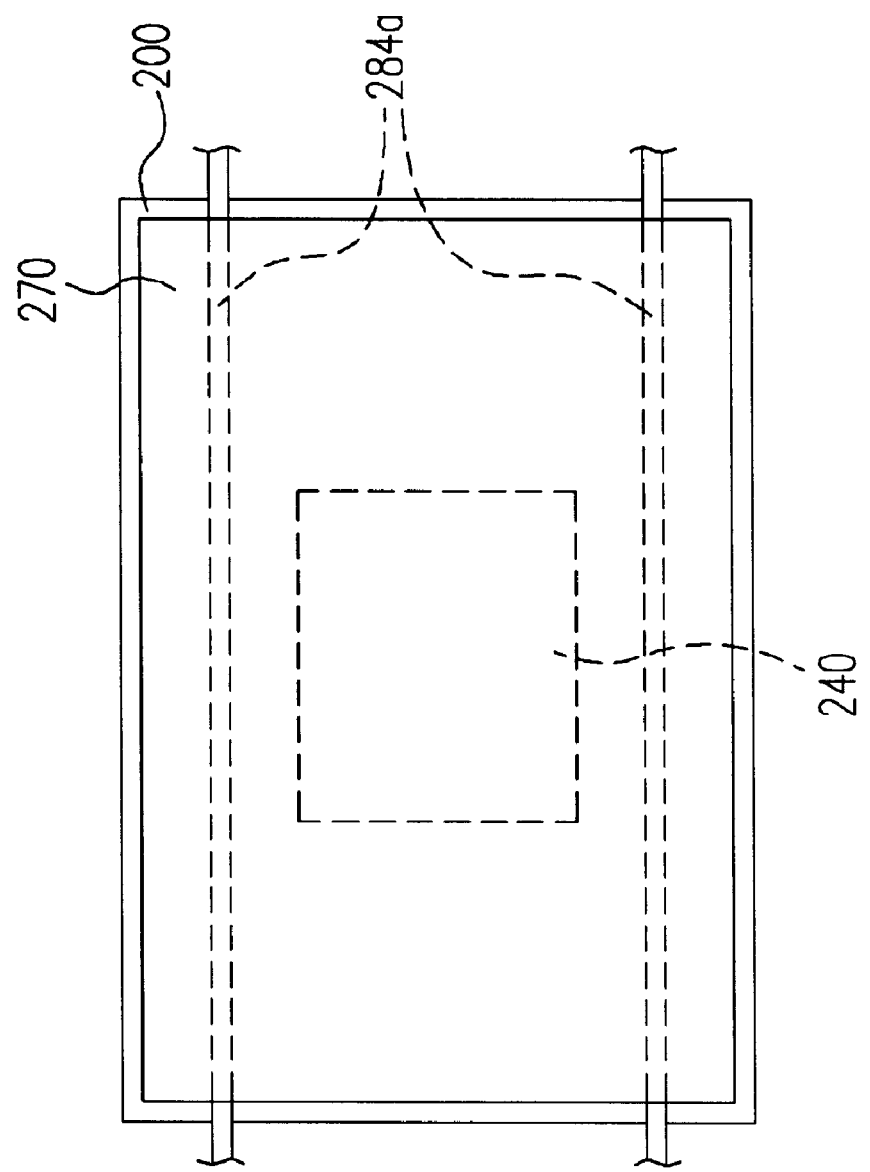
FIG. 4 is a top view of the package structure according to another preferred embodiment of the present invention.
Figure 5:
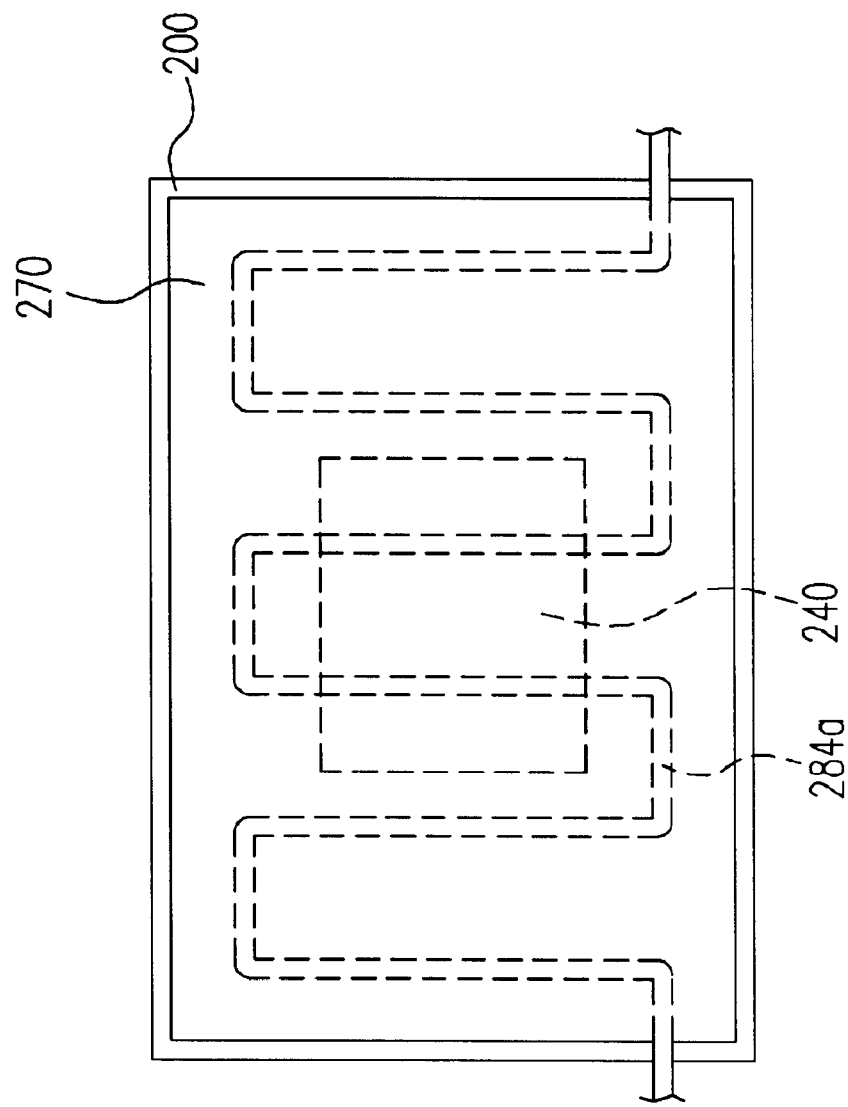
FIG. 5 is a top view of the package structure according to another preferred embodiment of the present invention.

FIGS. 3–5 are top views of the package structure according to the preferred embodiments of the present invention. The cooling tubule 284a is arranged to either pass through the space within the mold compound or resides on the inner top surface of the mold compound 270. The cooling tubule 284a preferably has no contact with the electronic devices on the active surface or the gold wires. However, with a flip-chip structure, the cooling tubule may contact the backside of the chip for heat dissipation. Referring to FIG. 3, the cooling tubule 284a is arranged as a single tube (shown by the dot line) above the chip 240 (shown by the dot line). Alternatively, the cooling tubule 284a can be arranged as two or more parallel tubes (as shown in FIG. 4) or arranged in an S or a serpentine shape (as shown in FIG. 5). The arrangement of the inside tubing can be a wave-like shape or a spiral shape. Within the scope of the present invention, the arrangement of the tubing is not limited to the cited shapes but includes various shapes feasible to persons skilled in the art.

Figure 6:
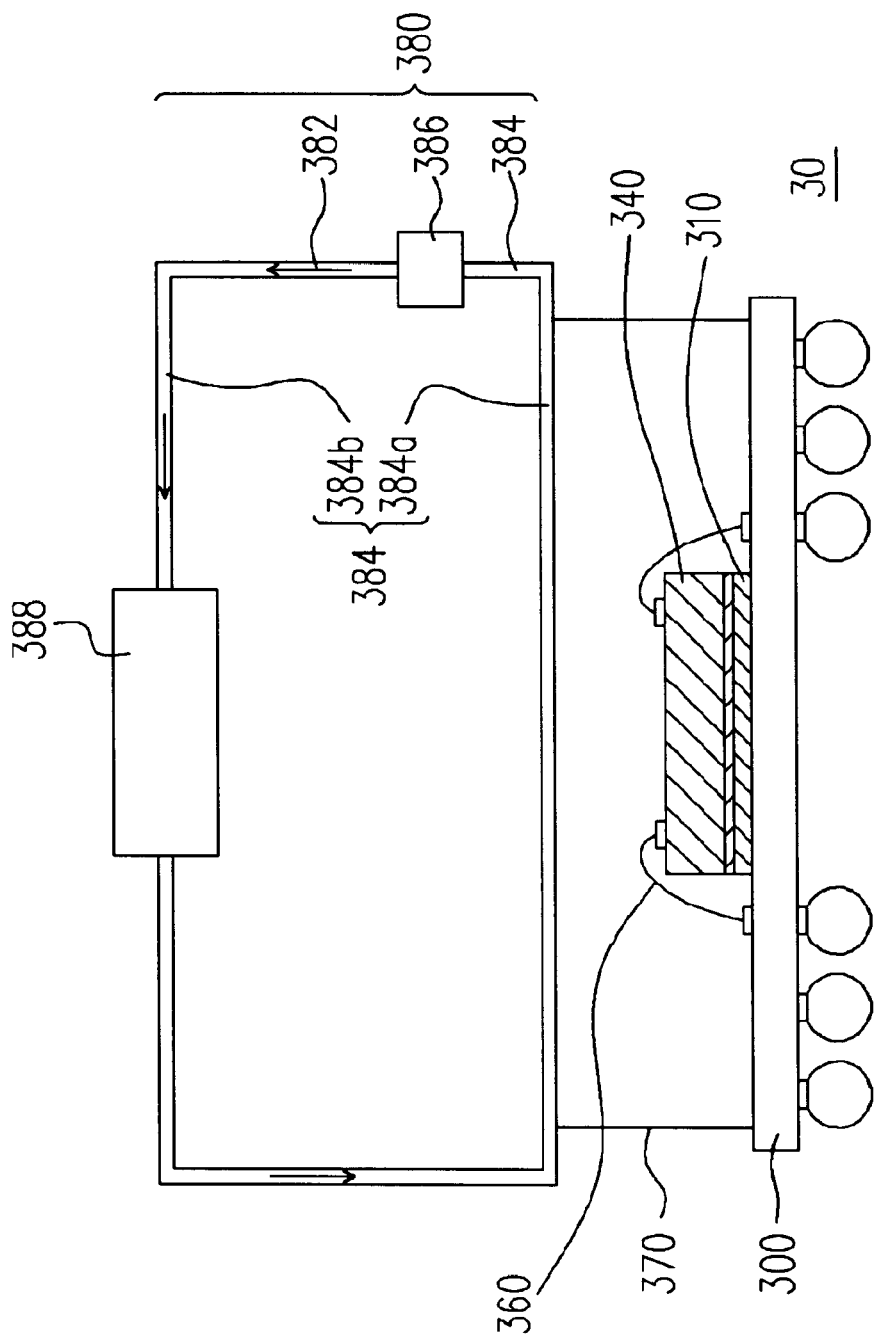
FIG. 6 is a cross-sectional view of a package structure according to another preferred embodiment of this invention.

FIG. 6 is a cross-sectional view of a package structure according to another preferred embodiments of the present invention. Because the package structure 30 is similar to the package structure 20 in FIG. 2, the connection or the arrangement of the package structure 30 will not be described here in details. The package structure 30 includes a chip 340 arranged on a die pad 310 on a carrier 300. The chip 340 is electrically connected to the carrier 300 through gold wires 360. A mold compound 370 covers the chip 340, the gold wires 360 and one surface of the carrier 300.

Referring to FIG. 6, a cooling system 380 includes a tubing 384 for transporting or circulating a fluid 382 and a pump 386. The fluid is, for example, water, coolants, gases or other cooling agents. The tubing 384 is made of metal or other suitable materials, for example. The pump 386 is coupled to the tubing 384 for pumping the fluid 382. The cooling system 380 is a close circulation system. That is, the fluid 382 is only circulating within the tubing 384 through the drive of the pump 386. The tubing 384 includes a cooling tubule 384a disposed on an upper and outer surface of the mold compound 370 and a cooling tubing 384b fitted to the cooling tubule 384a. Normally, the cooling tubule 384a is arranged onto the surface of the mold compound 370 after the mold compound 370 is applied. The cooling tubule 384a and the cooling tubing 384b can be fitted through connectors or fittings commonly used in the field. The arrangement of the cooling tubule can be of various shapes, including a stripe pattern, a wave-like shape or a spiral shape. Within the scope of the present invention, the arrangement of the tubing is not limited to the cited shapes but including various shapes feasible to persons skilled in the art.

The cooling system 380 can further include a cooler 388 connected to the tubing 384 for enhancing the cooling efficiency of the cooling system 380. Different kinds of coolers can be used as the cooler 388, including cooling fins, air blowers or fans, heat exchanger and low temperature fluid tank. The cooler 388 can have heat exchange with the fluid 382, thus dissipating heat from the fluid 382.

As described above, the fluid 382, circulating through the tubing 384 by the drive of the pump 386, can help dissipate heat generated within the mold compound 370. With the cooling system 380, the generated heat can be efficiently removed or transferred away, thus maintain performance of the devices and slow down the deterioration speed of the devices.

The present invention has the following advantages: (1) the package structure of the present invention can efficiently transfer away the heat generated by the devices in the chip, thus maintaining the performance of the chip. (2) the package structure of the present invention can efficiently transfer away the heat generated by the devices in the chip, thus extending the life of the devices.

Even though the package structure described in the embodiments is a wiring ball grid array (BGA) structure, the scope of the present invention will not be limited to this package structure. Moreover, the carrier is nit limited to the polymer carrier, but can be lead frames, ceramic carriers or glass carriers. The chip can be connected to the carrier through wiring, flip-chip or tape automatic bonding.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure that is compatible with a cooling system, comprising:
   a carrier;
   at least a chip, arranged on the carrier and electrically connected to the carrier,
   a mold compound, covering the chip and one surface of the carrier; and
   a cooling tubule disposed directly on an outer surface of the mold compound, wherein the cooling tubule is connected to the cooling system, wherein the cooling system is a closed system and a fluid driven by a pump circulates within the cooling tubule and the cooling system.

2. The package structure of claim 1, wherein the cooling system comprises a cooling tubing and the cooling tubule is connected to the cooling tubing.

3. The package structure of claim 1, wherein the fluid is selected from the group consisting of water, a coolant and a gas.

4. The package structure of claim 1, wherein the cooling system further comprises a cooler connected to the cooling tubing.

5. The package structure of claim 1, wherein a material of the mold compound includes thermosetting plastics.

6. The package structure of claim 1, wherein a material of the mold compound includes an epoxy resin.

* * * * *